US008385107B2

(12) United States Patent
Prejbeanu

(10) Patent No.: US 8,385,107 B2
(45) Date of Patent: *Feb. 26, 2013

(54) MAGNETIC MEMORY WITH A THERMALLY ASSISTED SPIN TRANSFER TORQUE WRITING PROCEDURE USING A LOW WRITING CURRENT

(75) Inventor: Ioan Lucian Prejbeanu, Sassenage (FR)

(73) Assignee: Crocus Technology SA, Grenoble Cedex (FR)

( * ) Notice: Subject to any disclaimer, the term of this patent is extended or adjusted under 35 U.S.C. 154(b) by 180 days.

This patent is subject to a terminal disclaimer.

(21) Appl. No.: 12/773,318

(22) Filed: May 4, 2010

(65) Prior Publication Data

US 2011/0110151 A1   May 12, 2011

(30) Foreign Application Priority Data

May 8, 2009   (EP) ..................................... 09290340

(51) Int. Cl.
*G11C 11/10* (2006.01)
*G11C 11/15* (2006.01)
(52) U.S. Cl. ........................................ 365/158; 365/171
(58) Field of Classification Search .................. 365/158, 365/171
See application file for complete search history.

(56) References Cited

U.S. PATENT DOCUMENTS

| | | | |
|---|---|---|---|
| 4,949,039 A | 8/1990 | Grunberg | |
| 5,159,513 A | 10/1992 | Dieny et al. | |
| 5,343,422 A | 8/1994 | Kung et al. | |
| 5,583,725 A | 12/1996 | Coffey et al. | |
| 5,695,864 A | 12/1997 | Slonczewski | |
| 6,172,902 B1 | 1/2001 | Wegrowe et al. | |
| 6,603,677 B2 * | 8/2003 | Redon et al. | 365/158 |
| 6,950,335 B2 * | 9/2005 | Dieny et al. | 365/171 |
| 2005/0002228 A1 | 1/2005 | Dieny et al. | |
| 2005/0040433 A1 | 2/2005 | Nozieres et al. | |
| 2006/0102971 A1 | 5/2006 | Lee et al. | |
| 2006/0291276 A1 | 12/2006 | Nozieres et al. | |
| 2008/0049488 A1 * | 2/2008 | Rizzo | 365/158 |
| 2008/0084724 A1 * | 4/2008 | Nozieres et al. | 365/50 |
| 2008/0164502 A1 | 7/2008 | Fukumoto et al. | |

OTHER PUBLICATIONS

Nakayama et al., Spin Transfer Switching in TbCoFe/CoFeB/MgO/CoFeB/TbCoFe Magnetic Tunnel Junctions with Perpendicular Magnetic Anisotropy, 2008, Journal of Applied Physics, 103.*
I.L. Prejbeanu, M Kerekes, R C Sousa, H Sibuet, O Redon, B Dieny, J P Nozieres; "Thermally Assisted MRAM", Journal of Physics: Condensed Matter, IOP Publishing, J. Phys: Condens, Matter 19 2007 165218 , 23 pp.
European Search Report for EP09290340, dated Nov. 4, 2009.

* cited by examiner

*Primary Examiner* — Hoai V Ho
*Assistant Examiner* — Jay Radke
(74) *Attorney, Agent, or Firm* — Pearne & Gordon LLP

(57) ABSTRACT

A magnetic random access memory (MRAM) cell with a thermally assisted switching (TAS) writing procedure, comprising a magnetic tunnel junction formed from a ferromagnetic storage layer having a first magnetization adjustable at a high temperature threshold, a ferromagnetic reference layer having a fixed second magnetization, and an insulating layer, said insulating layer being disposed between the ferromagnetic storage and reference layers; a select transistor being electrically connected to said magnetic tunnel junction and controllable via a word line; a current line, electrically connected to said magnetic tunnel junction, passing at least a write current; characterized in that the magnetocrystalline anisotropy of the ferromagnetic storage layer is substantially orthogonal with the magnetocrystalline anisotropy of the ferromagnetic reference layer. The STT-based TAS-MRAM cell achieves simultaneously thermal stability and requires low write current density.

10 Claims, 7 Drawing Sheets

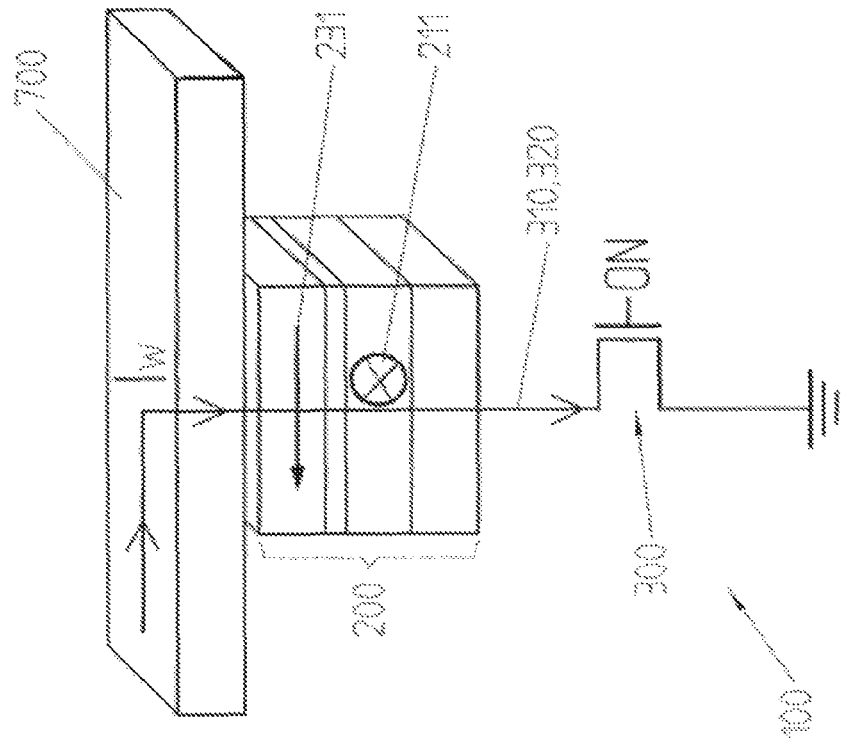
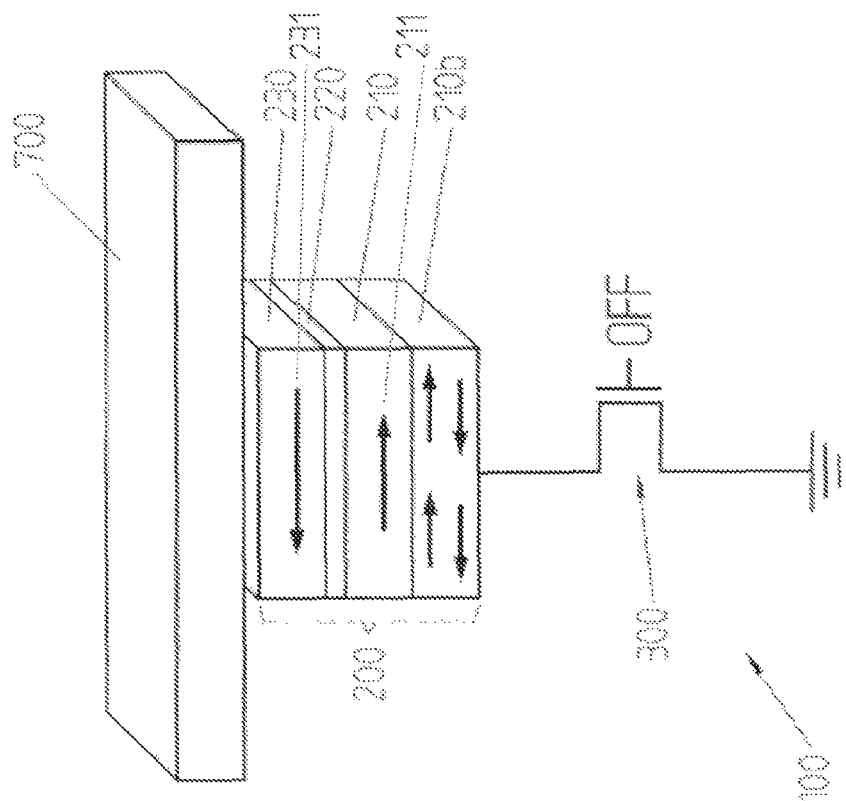

MAGNETIC MEMORY WITH A THERMALLY ASSISTED SPIN TRANSFER TORQUE WRITING PROCEDURE USING A LOW WRITING CURRENT

FIELD

The present invention relates to magnetic random access memory (MRAM) and, more particularly, to magnetic tunnel junction (MTJ)-based memory cells with a thermally assisted switching (TAS) spin transfer torque writing procedure using a low writing current and having low power consumption and high writing speed.

BACKGROUND

Magnetic random-access memories (MRAM) have been the object of a renewed interest with the discovery of magnetic tunnel junctions having a strong magnetoresistance at ambient temperature. These MRAM present many advantages such as speed (a few nanoseconds of duration of writing and reading), non volatility, and insensitivity to ionizing radiations. Consequently, they are increasingly replacing memory that uses more conventional technology based on the charge state of a capacitor (DRAM, SRAM, FLASH).

A conventional MRAM cell 1, in the simplest implementation, is represented in the example of FIG. 1. The cell 1 comprises a magnetic tunnel junction 2, formed from an insulating layer 22 disposed between a reference layer 23, having a fixed magnetization, and a storage layer 21, having a magnetization which direction can be changed upon writing of the memory cell. A first current line 4 is in communication with the storage layer 21, and a second current line 5 is placed orthogonal with the first current line 4, in communication with the reference layer 23. The MRAM cell 1 further comprises a CMOS select transistor 3, electrically connected to the magnetic tunnel junction 2, and which opening and closing is controlled by a word line 6 in order to address each MRAM cell 1 individually.

The reference and the storage layers, of different coercivity, are typically made of 3d metals such as Fe, Co or Ni or their alloys. Eventually, boron can be added in the layer composition in order obtain an amorphous morphology and a flat interface. The insulating layer typically consists of alumina ($Al_2O_3$) or magnesium oxide (MgO). Preferably, the reference layer consists of several layers forming a synthetic antiferromagnetic layer, as described in U.S. Pat. No. 5,583,725.

During a write operation, the transistor 3 is off and no current flows through the junction 2. A first field current 41 is passed through the first current line 4, generating a first magnetic field 42, and a second field current 51 is passed through the second current line 5, generating a second magnetic field 52. The intensity and synchronization of the first and second field currents 41, 51 are adjusted so that only the magnetization of the storage layer 21, located at the intersection of the two active current lines 4, 5, can switch, to write data, under the combined effect of the first and second magnetic fields 42, 52, respectively.

During a read operation, the transistor 3 is open allowing for a sense current (not shown) to flow through the magnetic tunnel junction 2 via the first current line 4, allowing for measuring the magnetic tunnel junction resistance R. When the respective magnetizations of the reference and storage layers 23, 21 are antiparallel, the junction resistance is high ($R_{max}$) corresponding to a low logic state "0". On the other hand, when the respective magnetizations are parallel, the resistance becomes low ($R_{min}$) corresponding to a high logic state "1". The logic state of the cell 1 is usually determined by comparing the junction resistance R to a reference cell, or an array of reference cells, each reference cell having a resistance of typically $R_{ref}=(R_{min}+R_{max})/2$, corresponding to a value in-between the high logic state "1" and low logic state "0".

In order to ensure that the MRAM cell of FIG. 1 is working properly during the write operation, i.e., in order to obtain a bi-stable switching of the magnetization of the storage layer 21, the magnetic tunnel junction 2 must have an anisotropic form, preferably with an aspect ratio of 1.5 or higher. The anisotropic form of the junction 2 allows for good writing selectivity of the MRAM cell 1 located at the intersection of the two active current lines 4, 5, compared with other cells 1 in an array, addressed by only one of the lines 4, 5. Indeed, the switching of the magnetization of the storage layer 21 in the junction 2 with an anisotropic form is possible only under the influence of the two magnetic fields 42, 52, generated by the lines 4, 5. MRAM cells 1 having an anisotropic form also show good thermal and/or temporal stability of the written data.

Other exemplary configurations of conventional MRAM cells can be found in U.S. Pat. Nos. 4,949,039 and 5,159,513, while U.S. Pat. No. 5,343,422 is concerned with the implementation of a random-access memory (RAM) based on a MRAM cell structure.

A MRAM cell configuration with a thermally assisted switching (TAS) writing procedure is described in document US2005002228 and represented in FIGS. 2a and 2b. In the example of FIG. 2a, the TAS-MRAM cell 10 differs from the MRAM cell 1 represented in FIG. 1 by having a current line 7, electrically connected to the magnetic tunnel junction 2, and a field line 8, placed above and perpendicular to the current line 7 in communication with the ferromagnetic storage layer 21.

The magnetic tunnel junction 2, represented in more detail in FIG. 2b, comprises an antiferromagnetic reference layer 24, exchange biasing the adjacent ferromagnetic reference layer 23 in order to pin its magnetization below a temperature corresponding to the blocking temperature $T_{BR}$ of the antiferromagnetic reference layer 24. The junction 2 also comprises an exchange coupling antiferromagnetic storage layer 21b, able to pin the magnetization of the adjacent ferromagnetic storage layer 21 below a temperature corresponding to the blocking temperature $T_{BS}$ of the antiferromagnetic storage layer 21b. Typically, a blocking temperature $T_{BR}$ up to about 400° C. can be attained when the antiferromagnetic reference layer is made of a NiMn or a PtMn-based alloy, while a blocking temperature $T_{BS}$ of about 200° C. to 150° C. is achieved when the antiferromagnetic storage layer is made of an IrMn-based alloy or a FeMn-based alloy, respectively. The magnetic tunnel junction 2 also comprises an insulating layer 22 disposed between a ferromagnetic reference layer 23 and the ferromagnetic storage layer 21, as described above.

During a write operation of the TAS-MRAM cell 10, a heating current pulse 31 is sent through the magnetic tunnel junction 2 via the current line 7 when the select transistor 3 is on, in order to increase the temperature of the magnetic tunnel junction 2. Using a heating current 31 lasting several nanoseconds with a current density between $10^5$ A/cm$^2$ and $10^7$ A/cm$^2$, the junction 2 can be heated to a high temperature threshold between 120° C. and 200° C., lying between $T_{BS}$ and $T_{BR}$. At such a temperature, the magnetic coupling between the ferromagnetic storage layer 21 and antiferromagnetic storage layer 21b disappears and the magnetization of the storage layer 21 can be freely adjusted. The heating current 31 is then turned off by setting the select transistor 3 off. During the cooling of the magnetic tunnel junction 2 a field current 81 is passed in the field line 4, in order to generate a magnetic field 82 capable of reversing the magnetization direction of the storage layer 21. The magnetization is then fixed in its reversed orientation once the junction 2 has cooled to a low temperature threshold at which the storage layer 21 is pinned.

In contrast with the MRAM cell configuration of FIG. 1, the TAS-MRAM cell 10 of FIGS. 2a and 2b is characterized by a considerably improved thermal stability of the storage layer 21, exchange biased by the antiferromagnetic storage layer 21b. An improved writing selectivity is also achieved due to the selective heating of the TAS-MRAM cell 10 to be written, in comparison with the neighboring cells remaining at ambient temperature. The TAS-MRAM cell 10 allows for a better stability in a zero magnetic field (retention) by using materials with high magnetic anisotropy at ambient temperature, and a higher integration density without affecting its stability limit. Moreover, reduced power consumption is achieved during the write operation of the TAS-MRAM cell 10, since the heating current 31 and the field current 81 required to heat the cell 10 and switch the magnetization of the storage layer 21, respectively, are lower than the respective first and second field currents 41, 51, used in the MRAM cell configuration of FIG. 1.

An improvement of the TAS-MRAM cell where the magnetic tunnel junction has a circular geometry is disclosed in the patent application having publication number US20060291276. Here, the field current is determined only by the magnetocrystalline anisotropy of the storage layer without contribution from the shape anisotropy, yielding to a further reduction in field current and to lower power consumption.

Another improvement with respect to the above MRAM architectures is the spin transfer torque (STT) architecture, represented schematically in FIG. 3 and initially described in U.S. Pat. Nos. 5,695,864 and 6,172,902. In contrast with the cell configuration of FIG. 2a, the STT-based MRAM cell 100 of FIG. 3 does not require the field line 8. Indeed, during the write operation of the cell of FIG. 3, instead of applying a magnetic field, a spin polarized current 32 is passed through the magnetic tunnel junction 2 when the select transistor 3 in the open mode (ON). The spin-polarized current 32 exerts a torque able to switch the magnetization of the storage layer 21 in a direction corresponding to the magnetization of the reference layer 23.

U.S. Pat. No. 6,950,335 describes a STT-based MRAM cell 100 with a TAS writing procedure using the cell configuration shown in FIG. 3 and the magnetic tunnel junction 2 represented in FIG. 2b. During the write operation of the STT-based TAS-MRAM cell 100, the heating current pulse 31 is sent through the magnetic tunnel junction 2 in order to heat the junction 2 to a high temperature threshold at which the magnetization of the storage layer 21 can be freely adjusted, as described above. The heating current 31 is then turned off by by turning off the select transistor 3 and, during the cooling of the magnetic tunnel junction 2, the spin polarized current 32 is passed through the junction 2 in order to switch the magnetization of the ferromagnetic storage layer 21.

The STT-based TAS-MRAM cell 100 is a promising route for high density MRAM because the write current, or spin polarized current 32, scales directly with the cell size, which is not the case in the previously described implementations. Indeed the spin polarized current 32 scales in an inversely proportional fashion with the area of the magnetic tunnel junction 2. Moreover, STT-based TAS-MRAM cells 100 allow for fast switching of the storage layer magnetization and for higher cell density since no magnetic field line is required.

The STT-based TAS-MRAM cell 100 described above involves a so-called longitudinal configuration where the spins of the spin-polarized current 32 are injected collinearly with the magnetization of the storage layer 23. Such longitudinal configuration is normally achieved during the fabrication process of the cell 100, by depositing the reference and storage layers 23, 21 in the presence of an external magnetic field, applied with a field direction during the deposition of the reference layer 23 that is collinear to the direction of the field applied during the deposition of the storage layer 21. This is illustrated in FIGS. 5a to 5b where the external magnetic field directions during the deposition of the reference layer 21 (FIG. 5a) and storage layer 23 (FIG. 5b), are represented by the plain arrow. In FIG. 5a-c, the circles represent schematically the magnetic tunnel junction 2 viewed from the top. FIG. 5c shows the direction of the external field (dashed arrow) applied during the annealing of the magnetic tunnel junction 2 after deposition of the layers. Annealing of the junction 2 is typically performed at a temperature higher than 300° C.

The STT-based TAS-MRAM cell 100 suffers from requiring high spin polarized current densities, typically in the order of 4 MA/cm$^2$ for a pulse width of 10 ns, and increasing for shorter pulse width, in order to switch the magnetization of the storage layer 21. This results in large and unpractical cell sizes, due to large select transistors 3 necessary to drive such high currents. High currents may also yield high power dissipation, and possible wear and loss of the magnetic tunnel junction 2 reliability, in particular of the insulating layer 22. For small cell size, for example below 45 nm, simultaneous thermal stability and a small write spin polarized current is difficult to achieve. Moreover, the speed of the write operation is limited to the 10 ns range since the switching of storage layer magnetization is triggered by thermal activation which is stochastic in nature.

In order to decrease the spin-polarized current density, U.S. Pat. No. 6,603,677 proposes adding a "spin polarizing" layer or using a synthetic antiferromagnetic (SAF) multilayer. Improving the stability of the STT-based TAS-MRAM cell has also been addressed by Nakayama et al, Journ. Appl. Phys. 103, 07A710 (2008), who propose using perpendicularly magnetized magnetic layers, or in U.S. Pat. No. 6,950, 335, disclosing a combination of TAS and STT. However, none of the above solutions allows for a significant reduction in the write current density.

SUMMARY

An object of the invention is therefore to propose a spin transfer torque (STT)-based magnetic random access memory (MRAM) cell with a thermally assisted switching (TAS) writing procedure which overcomes at least some limitations of the prior art.

Another object of the invention is to provide a STT-based TAS-MRAM cell that can be written with a smaller write current than the one used in conventional STT-based TAS-MRAM cells.

According to the invention, these aims are achieved by means of a STT-based TAS-MRAM cell comprising: a magnetic tunnel junction formed from a ferromagnetic storage layer having a first magnetization adjustable at a high temperature threshold, a ferromagnetic reference layer having a fixed second magnetization, and an insulating layer, said insulating layer being disposed between the ferromagnetic storage and reference layers; a select transistor being electrically connected to said magnetic tunnel junction and controllable via a word line; a current line electrically connected to said magnetic tunnel junction (200), passing at least a write current; the magnetocrystalline anisotropy of the ferromagnetic storage layer being substantially orthogonal with the magnetocrystalline anisotropy of the ferromagnetic reference layer.

In an embodiment of the invention, the cell is writable by the write current passing through the junction via the current line, the write current having a first intensity for heating the junction at the high temperature threshold; and a second intensity, lower than the first intensity, for switching the first magnetization of the storage layer and cooling the magnetic tunnel junction at a low temperature threshold at which the first magnetization becomes fixed.

In another embodiment of the invention, the write current is a spin polarized current for switching the first magnetization in a direction determined by the spin polarized current.

In yet another embodiment of the invention, the magnetic tunnel junction further comprises an antiferromagnetic storage layer pinning said first magnetization of the ferromagnetic storage layer when the temperature of the junction is at or below the low temperature threshold and freeing said first magnetization when the temperature is at or above the high temperature threshold.

The present invention also encompasses a method of writing data in the TAS MTJ-based MRAM cell, the method comprising the steps of:

passing the write current through the magnetic tunnel junction via the current line, the write current having a first intensity for heating the magnetic tunnel junction;

after the magnetic tunnel junction has reached a high temperature threshold, decreasing the intensity of the write current to a lower second intensity for switching the first magnetization of the storage layer and cooling the magnetic tunnel junction;

after the magnetic tunnel junction has cooled down to a low temperature threshold at which the first magnetization becomes fixed, turning off the write current.

In an embodiment of the invention, said write current is a spin polarized current switching the first magnetization in a direction according to the spin orientation of the spin-polarized current.

In another embodiment of the invention, said switching the first magnetization is performed from an intermediate orientation, substantially orthogonal with the direction of the second magnetization, to a switched direction that is substantially parallel or antiparallel to the direction of the second magnetization.

The STT-based TAS-MRAM cell allows for achieving simultaneously thermal stability and a minimal write current density at very short pulse widths (below 10 ns).

BRIEF DESCRIPTION OF THE DRAWINGS

The invention will be better understood with the aid of the description of an embodiment given by way of example and illustrated by the figures, in which:

FIG. 2b is a detailed view of the magnetic tunnel junction of FIG. 2a;

FIG. 4a represents a STT-based TAS-MRAM cell according to an embodiment of the invention where the magnetizations of a storage and reference layers of a magnetic tunnel junction are shown for a low temperature threshold;

FIG. 4b shows the STT-based TAS-MRAM cell of FIG. 4a where the magnetizations of the storage and reference layers are shown for a high temperature threshold;

FIGS. 6a to c illustrate the direction of an external magnetic field being applied during the deposition of the (a) reference layer, (b) storage layer, and (c) during the annealing of the junction of the STT-based TAS-MRAM cell of FIG. 4a;

FIG. 8a shows a hysteresis loop measured for the cell configurations of FIG. 7a.

DETAILED DESCRIPTION OF THE PREFERRED EMBODIMENTS

Figure 1:
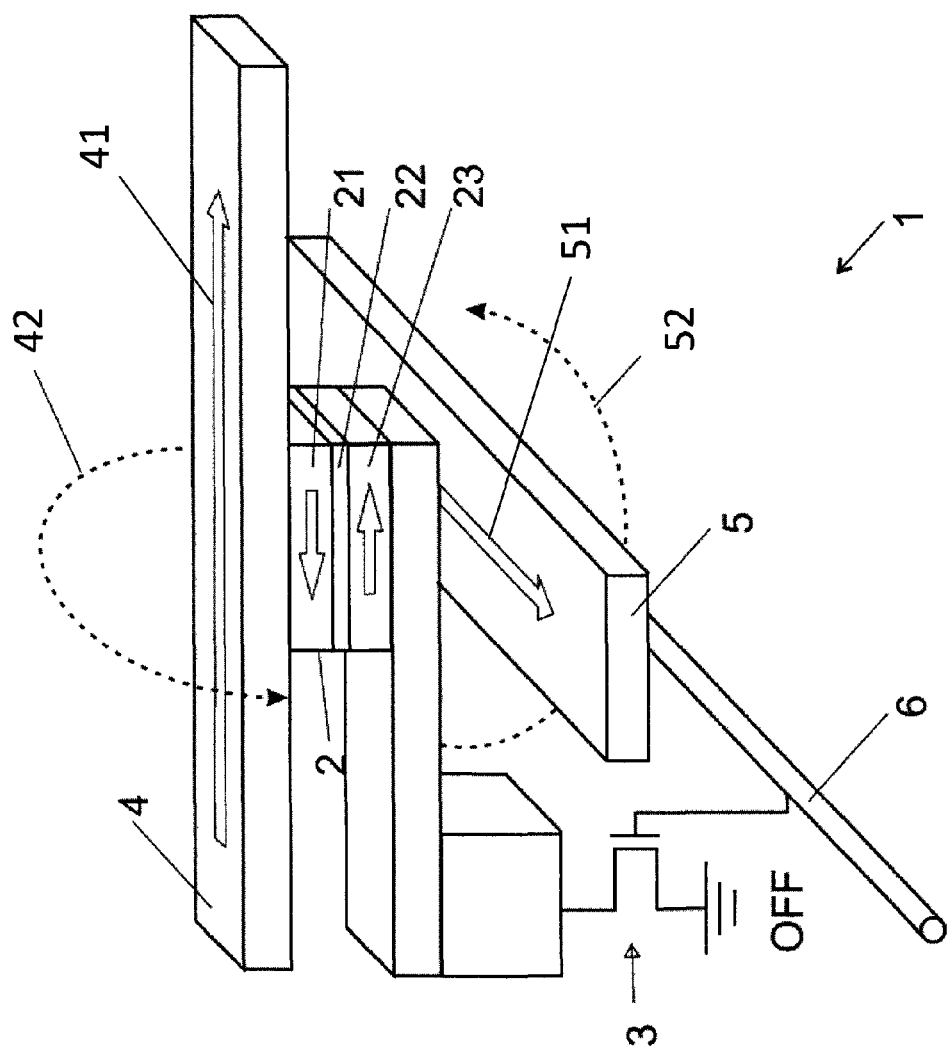
FIG. 1 represents a magnetic random-access memory (MRAM) cell of prior art.
Figure 2B:
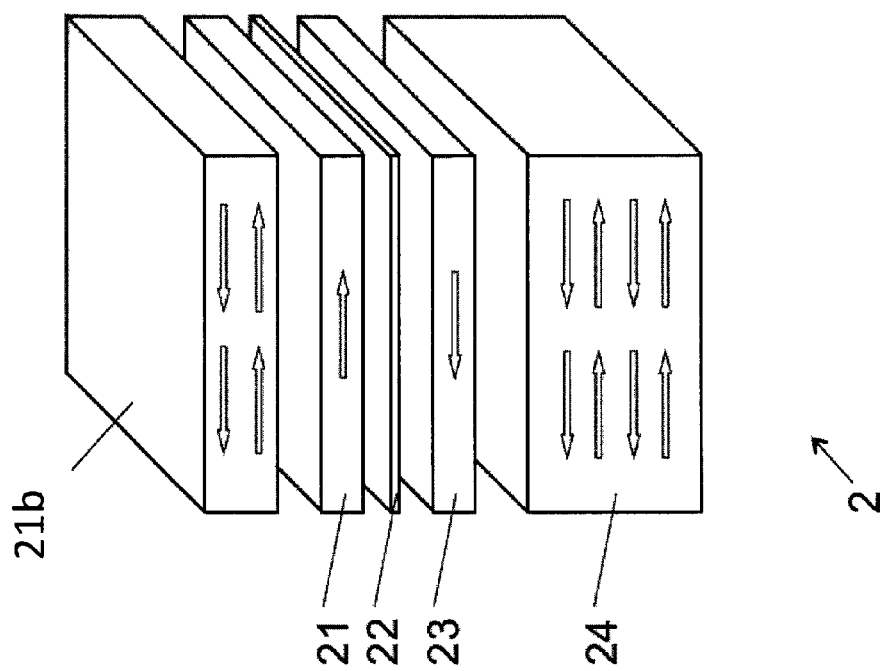
Figure 2A:
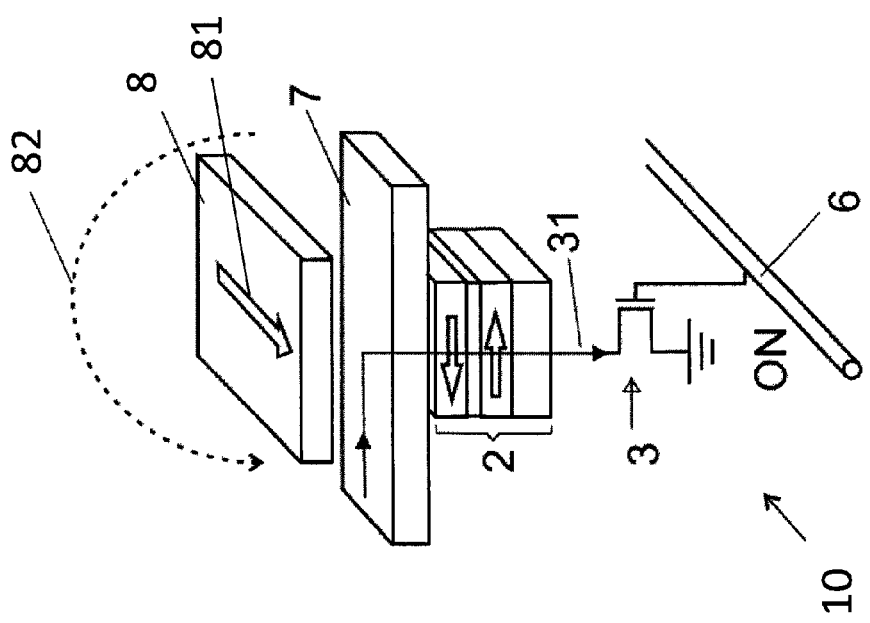
FIG. 2a illustrates schematically a MRAM cell configuration with a thermally assisted switching (TAS) writing procedure of prior art comprising a magnetic tunnel junction.
Figure 3:
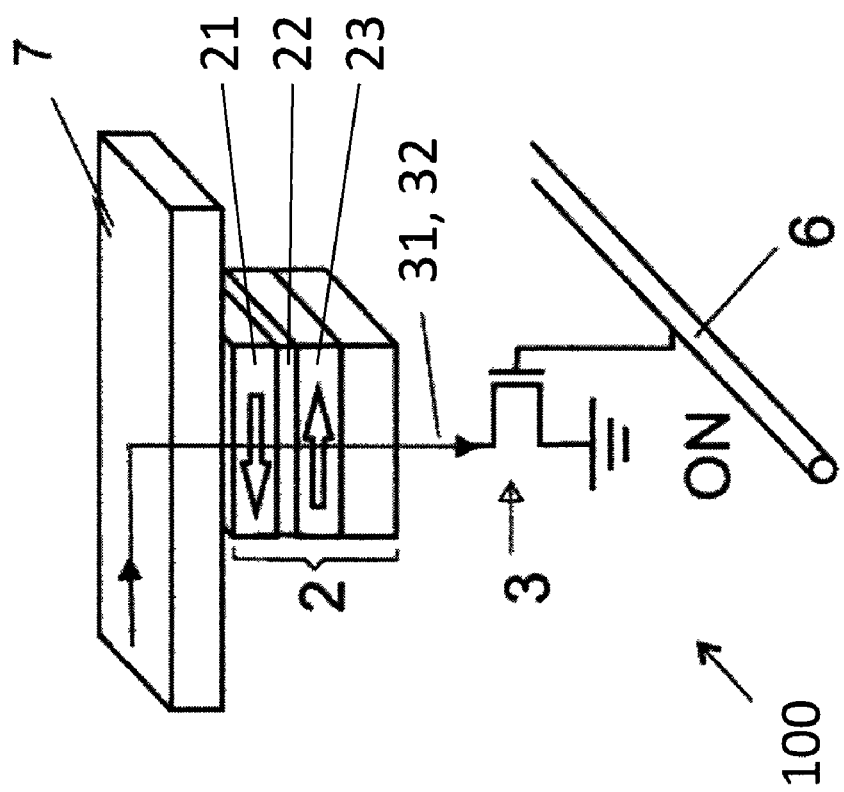
FIG. 3 illustrates schematically a spin transfer torque (STT)-based TAS-MRAM cell of prior art.

A spin transfer torque (STT)-based magnetic random-access memory (MRAM) cell 100 with a thermally assisted switching (TAS) writing procedure, according to an embodiment of the invention, is represented in FIGS. 4a and 4b. The STT-based TAS-MRAM cell 100 comprises a multilayer magnetic tunnel junction 200 formed from an insulating layer 220 being disposed between a ferromagnetic storage layer 210, having a first magnetization 211, and a reference layer, here a ferromagnetic reference layer 230, having a second magnetization 231. The junction 200 is in communication with select transistor 300 controlled by a word line (not shown). The STT-based TAS-MRAM cell 100 further comprises a current line 700 electrically connected to the magnetic tunnel junction 200.

In an embodiment of the invention, the magnetic tunnel junction 200 further comprises an antiferromagnetic storage layer 210b, exchange coupled with the adjacent ferromagnetic storage layer 210, and pinning the first magnetization 211 of the ferromagnetic storage layer 210 below a temperature, corresponding to the blocking temperature $T_{BS}$ of the antiferromagnetic storage layer 210b, and unpinning the first magnetization 211 above $T_{BS}$. The magnetic tunnel junction 200 also comprises an antiferromagnetic reference layer (not shown), typically made of a Mn based alloy such as PtMn or NiMn, exchange biasing the preferably adjacent ferromagnetic reference layer 230. The antiferromagnetic reference layer is characterized by a blocking temperature $T_{BR}$ higher than $T_{BS}$, and orients the magnetic moment of the ferromagnetic reference layer 230, generating a pinning field that fixes the second magnetization 231 of the ferromagnetic reference layer 230 at a temperature below $T_{BR}$.

In another embodiment of the invention not represented, the reference layer 230 is formed from a synthetic antiferromagnetic pinned layer comprising a first and second ferromagnetic reference layer, both formed of a Fe, Co or Ni-based alloy, and antiferromagnetically coupled by inserting between them a non-ferromagnetic reference layer made, for example, of ruthenium. In this embodiment, the antiferromagnetic reference layer is provided below the second ferromagnetic reference layer.

In an embodiment of the invention, the ferromagnetic storage layer 210 is made of an amorphous or nanocrystallized alloy based on a rare earth and on a transition metal, such as described in patent US2005040433 by the present applicant. The magnetic order of said alloy can be of ferrimagnetic type, and the ferromagnetic storage layer 210 can have a substantially planar magnetization. The use of amorphous or nanocrystallized alloy permits to significantly decrease the voltage applied across the magnetic tunnel junction 200 and required for the writing procedure, in order to avoid electric breakdown of the junction 200 and minimize the electric consumption of the memory cell 100.

Preferably, the ferromagnetic storage layer 210 has a thickness of the order of 1 to 10 nm and is made of a material having a planar magnetization, typically selected from the group Permalloy ($Ni_{80}Fe_{20}$), $Co_{90}Fe_{10}$ or other alloys containing Fe, Co or Ni. Also preferably, the antiferromagnetic storage layer 210b is made of a manganese-based alloy, for example, of IrMn or FeMn. The antiferromagnetic storage layer 210b has a blocking temperature $T_{BS}$ sufficiently high to ensure that at standby temperature, i.e., in the absence of heating, magnetization of the ferromagnetic storage layer 210 is sufficiently pinned to be able to preserve its magnetization over a period of several years but not so high as to make it necessary to heat the junction 200 during every the writing process at a temperature that could yield to junction material degradation and/or high power consumption. Here, a $T_{BS}$ in the range of, for example, 120 to 220° C. is suitable.

The insulating layer 220, playing the role of a tunnel barrier, is preferably made of a material selected from the group comprising $Al_2O_3$ and MgO. The tunneling resistance R of the junction 200 depends exponentially on the thickness of the insulating layer 220 and is measured by the resistance-area product (RA) of the junction 200. The RA must be sufficiently small in order to flow a heating current 310 through the junction 200 which is sufficiently high to raise the temperature of the antiferromagnetic storage layer 210b above its blocking temperature $T_{BS}$. For example, in order to force a heating current density in the range of $10^5$ A/cm² to $10^7$ A/cm², typically required to raise the temperature of the junction up to 100° C., the RA value should be of the order of 1 to 500 $\Omega \cdot \mu m^2$.

In yet another embodiment of the invention not represented, at least one thermal barrier layer having a very low thermal conductivity is added at the top and at the bottom of the junction 200. The purpose of these additional layers is to increase the heating efficiency of the current 310 flowing through the junction 200 while limiting the diffusion of the heat towards the electrode (not shown) ensuring the electrical connection between the junction 200 and the connecting current line 700.

In the STT-based TAS-MRAM cell 100 according to the invention as disclosed herein, the magnetocrystalline anisotropy of the ferromagnetic storage layer 210 is substantially orthogonal to the anisotropy of the antiferromagnetic layer 210b which pins the ferromagnetic storage layer 210, and to the magnetocrystalline anisotropy of the ferromagnetic reference layer 230. This implies that the first magnetization 211 of the ferromagnetic storage layer 210 is aligned substantially orthogonal to the direction of the second magnetization 231 of the reference layer 230, after the magnetic tunnel junction 200 has been heated at a high temperature threshold comprised above the blocking temperature $T_{BS}$ of the antiferromagnetic storage layer 210b but below the blocking temperature of the $T_{BR}$ of the antiferromagnetic reference layer. In FIG. 4b, the first magnetization 211 of the ferromagnetic storage layer 210 is represented entering the page while the second magnetization direction 231 of the ferromagnetic reference layer 230 is shown oriented toward the left. The first and second magnetizations 211, 231 could also be drawn outward the page and toward the right, respectively, or have any other directions as long as the first magnetization 211 is oriented substantially perpendicular to the second magnetization 231. FIG. 4a represents the STT-based TAS-MRAM cell 100 at a temperature below $T_{BS}$, for example at room temperature, with the first magnetization 211 being aligned substantially antiparallel to the second magnetization 231. Here, the first magnetization could also be substantially parallel to with the second magnetization 231.

Figure 6:
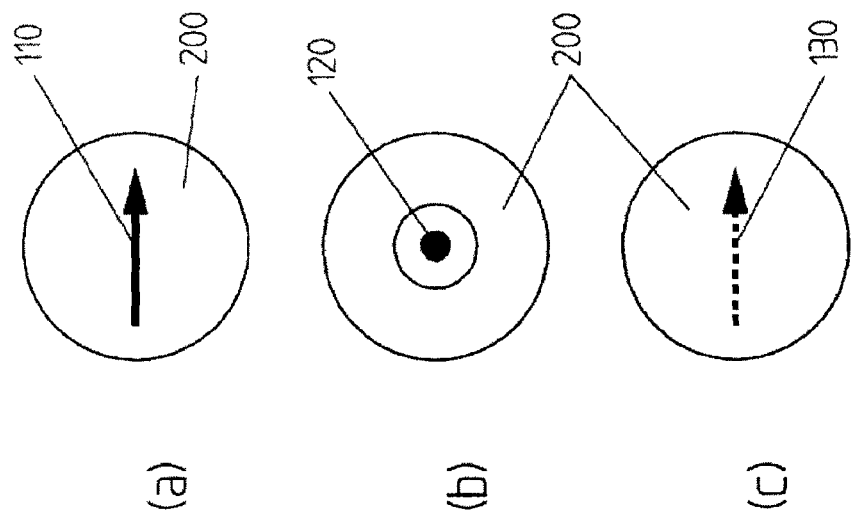
Figure 5:
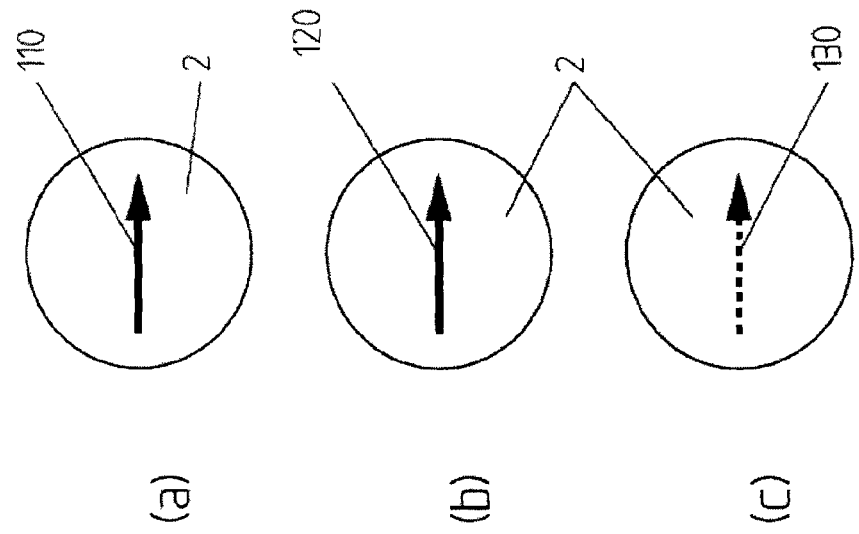
FIGS. 5a to c illustrate the direction of an external magnetic field being applied during the deposition of the (a) reference layer, (b) storage layer, and (c) during the annealing of the junction of the STT-based TAS-MRAM cell of FIG. 3.

The magnetocrystalline anisotropy of the ferromagnetic storage layer 210 is substantially orthogonal to the magnetocrystalline anisotropy of the ferromagnetic reference layer 230 is obtained by depositing the ferromagnetic storage layer 210 in the presence of an external magnetic field applied with a field direction that is substantially orthogonal to the one of the external magnetic field applied during the deposition of the ferromagnetic reference layer 230. This is schematically represented in FIGS. 6a to 6c where the circles represent the magnetic tunnel junction 200 viewed from the top. More particularly:

during the deposition process of the ferromagnetic reference layer 230 (FIG. 6a), the external magnetic field is applied with a first field direction 110 represented by the plain arrow; and during the deposition of the ferromagnetic storage layer 210 (FIG. 6b), the external magnetic field is applied with a second field direction 120, shown entering the page, substantially perpendicular to the first field direction 110.

After the deposition of the different layers of the magnetic tunnel junction 200, the latter is annealed at a temperature typically higher than 300° C. During the annealing step (FIG. 6c), the external magnetic field is applied with a third field direction 130, represented by the dashed arrow, oriented substantially parallel or antiparallel to the first field direction 110. Other orientations of the first, second and third field directions 110, 120, 130 are however possible in so far the second field direction 120 is oriented substantially perpendicular to the first and third field directions 110, 130.

In another embodiment of the invention, the magnetocrystalline anisotropy of the ferromagnetic storage layer 210 substantially perpendicular to the ferromagnetic reference layer magnetization, is obtained by having the junction 200 with an ellipticity larger than 1, with the long axis of the junction 200 being oriented orthogonal to the direction of the anisotropy of the antiferromagnetic storage layer 210b.

The magnetocrystalline anisotropy of the ferromagnetic storage layer 210 substantially orthogonal to the magnetocrystalline anisotropy of the ferromagnetic reference layer 230 is advantageous when the ferromagnetic storage layer 21 is exchange biased with the antiferromagnetic layer 21b as it is the case for the TAS write operation.

Figure 7:
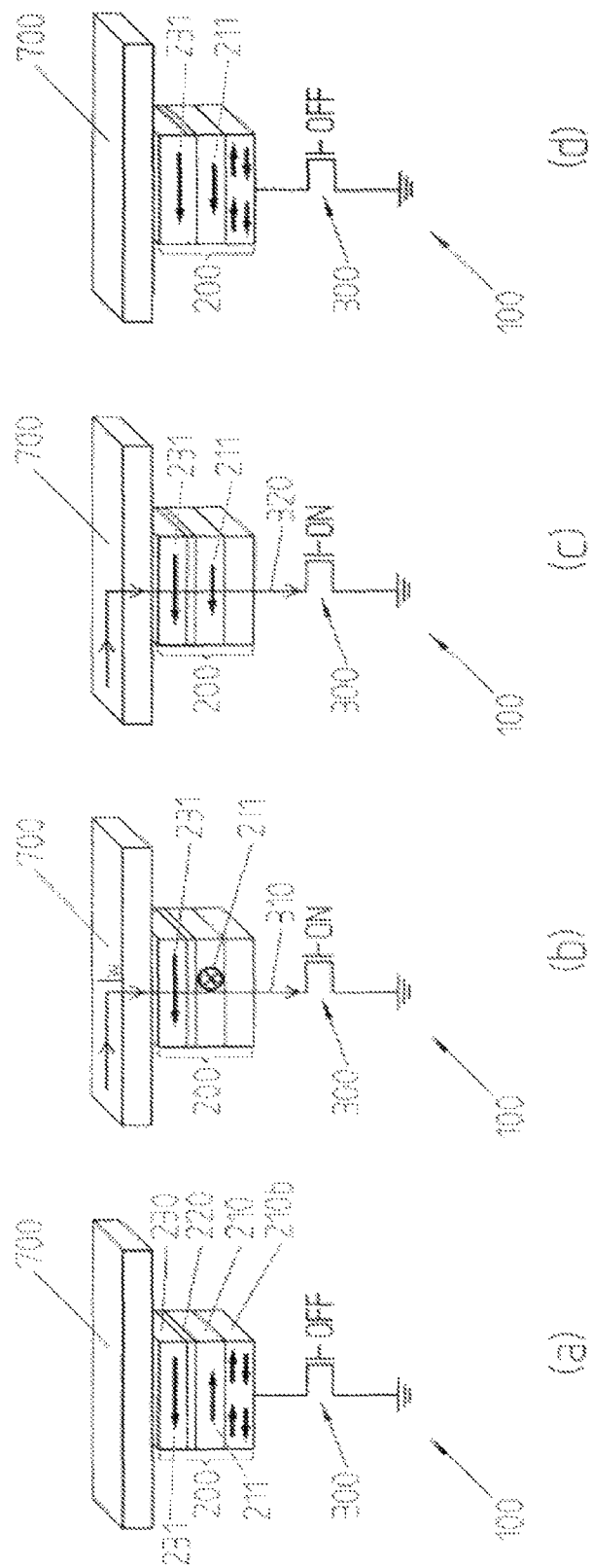
FIGS. 7a to 7d illustrate schematically a write operation performed on the STT-based TAS-MRAM cell of FIG. 4a, according to an embodiment of the invention, showing (a) an initial state, (b) a heating step, (c) a writing step, and (d) a cooling step.

A write operation for writing data on the STT-based TAS-MRAM cell 100, according to an embodiment of the invention, is represented schematically in FIGS. 7a to 7d. In an initial configuration represented in FIG. 7a, where the junction 200 is at a low temperature threshold below the blocking temperature $T_{BS}$ of the antiferromagnetic storage layer 210b, for example at room temperature, the direction of the first magnetization 211 of the ferromagnetic storage layer 210 is pinned by the anisotropy of the antiferromagnetic storage layer 210b and is collinear with the magnetization of the ferromagnetic reference layer 230. The cell 100 is represented with the transistor 300 in the closed mode (OFF) with no current flowing through the junction 200. In this configuration, the junction resistance R can be high, if the first and second magnetization 211, 231 are antiparallel as shown in FIG. 7a, or low, if the first and second magnetization 211, 231 are parallel.

According to an embodiment of the invention, during the write operation represented in FIGS. 7b and 7c, a write current, here a spin polarized current having a first intensity 310, is injected into the junction via the current line 700 when the select transistor 300 is open (ON) in order to increase the temperature of the magnetic tunnel junction 200. More particularly, the junction 200 is heated to the high temperature threshold, where the magnetic coupling between the ferromagnetic storage layer 210 and the antiferromagnetic storage layer 210b disappears. The first magnetization 211 being freely adjustable aligns itself along its anisotropy, i.e., in a direction substantially perpendicular to the direction of the second magnetization 231 of the ferromagnetic reference layer 230, pinned by the antiferromagnetic reference layer (FIG. 7b).

The intensity of the spin polarized current is then decreased to a second intensity 320, low enough to allow the magnetic tunnel junction 200 cooling down at the low temperature threshold, but high enough for the spin polarized current to be able to switch the first magnetization 211 of the ferromagnetic storage layer 210 before the low temperature threshold is reached and the first magnetization 211 becomes pinned. This is possible since the critical second intensity 320 of the spin-polarized current needed for the reversal of the magnetization of the ferromagnetic storage layer 210 is smaller than the first intensity 310, required for heating the junction 200 at the high temperature threshold. Here, the switching of the first magnetization 211 is performed from an intermediate orientation, substantially orthogonal to the direction of the second magnetization 231, to a switched direction, substantially parallel or antiparallel to the direction of the second magnetization 231.

After the magnetic tunnel junction 200 has cooled down to the low temperature threshold, the spin polarized current is turned off by setting the select transistor 300 in the close mode.

In a preferred embodiment of the invention, the spin polarized current having the second intensity 320 is able to align the first magnetization 211 of the ferromagnetic storage layer 210 until a temperature that is just below $T_{BS}$ has been reached. This ensures that the first magnetization 211 of the ferromagnetic storage layer 210 remains oriented according to the spin polarized current until the temperature has decreased just below the low temperature threshold where the first magnetization 211 is completely pinned by the antiferromagnetic storage layer 210b.

Here, the spin-polarized current becomes polarized when passing through the reference layer 230 according to the current flow direction so that the spins of the electrons penetrating into the ferromagnetic storage layer 210 are in majority oriented along the magnetization direction of the ferromagnetic reference layer 230. The spin-polarized current exert a torque on the first magnetization 211 of the ferromagnetic storage layer 210 in order to switch the first magnetization 211 in a direction corresponding to the second magnetization 231 of the ferromagnetic reference layer 230 (FIG. 7c). Since the injected spins are aligned substantially orthogonal to the orientation of the first magnetization 211, the torque is maximal allowing the reversing of the first magnetization 211. In the example of FIG. 7d, after the write operation described above, the first magnetization 211 becomes pinned in the opposite direction with respect to its initial direction shown in FIG. 7a.

The STT-based TAS-MRAM cell 100 according to the invention as disclosed herein allows for rapid reversal of the first magnetization 211. Indeed, the spins of the spin-polarized current 320 are oriented substantially orthogonal with the first magnetization 211 and exert a maximal torque on the first magnetization 211 at the moment the spin-polarized current 320 is applied and the temperature has reached, or is above, the low temperature threshold. The rapid reversal of the first magnetization 211 enables the use of a shorter and smaller spin-polarized current pulse 320 (below 10 ns) compared to conventional STT-based TAS-MRAM cells, thus increasing the writing speed and decreasing power consumption. Moreover, the STT-based TAS-MRAM cell 100 according to the invention as disclosed herein does not require the use an additional perpendicular polarizing layer in the magnetic tunnel junction 200, simplifying the fabrication of the junction 200.

After the cooling step and during a read operation (not represented), the select transistor 300 is open (ON) and a sense current is passed through the magnetic tunnel junction 200 via the current line 700. A voltage is measured across the junction 200 at a temperature below the low temperature threshold, for example at room temperature, yielding the corresponding junction resistance R. In the example of FIG. 7d, the direction of the first magnetization 211 being parallel with the direction of the second magnetization 231, a low junction resistance R is measured.

Figure 8B:
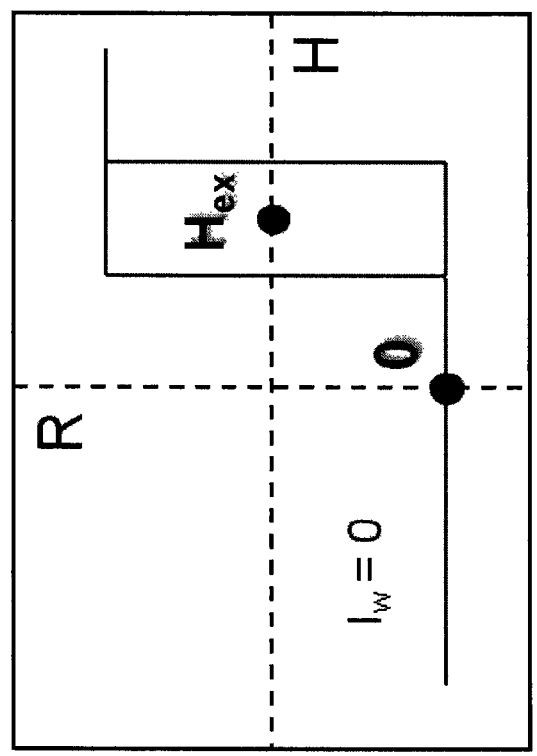
FIG. 8b shows a hysteresis loop measured for the cell configurations of FIG. 7b.
Figure 8A:
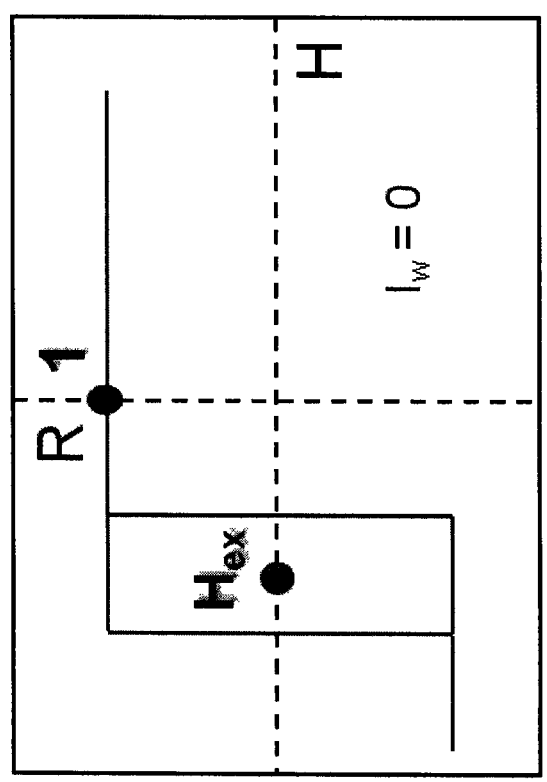

Hysteresis loops for cell configurations of FIG. 7a and FIG. 7b are respectively shown in FIGS. 8a and 8b, where the magnetic tunnel junction resistance R, measured at room temperature, is plotted against the magnetic field H. In FIG. 8a, the first magnetization 211 is antiparallel to the second magnetization 231 and the hysteresis loop is centred on the exchange coupling field $H_{ex}$ of the antiferromagnetic storage layer 210b being shifted to the left. This yields a high junction resistance R measured at H=0, corresponding to the logic state "1". In FIG. 8b, the first magnetization 211 is parallel with the second magnetization 231, resulting in a exchange coupling field $H_{ex}$ being shifted to the right and to a low junction resistance R measured at H=0, corresponding to the logic state "0".

It is understood that the present invention is not limited to the exemplary embodiments described above and other examples of implementations are also possible within the scope of the patent claims For example, in an embodiment of the invention (not represented), the write operation is performed by passing a first portion of current, here the heating current 310, through the magnetic tunnel junction 200 and, simultaneously or after the junction 200 has reached the high temperature threshold, passing a second portion of current, here a field current, through the current line 700; the field current being able to generate a magnetic field for switching the first magnetization 211 of the ferromagnetic storage layer 210 in a direction depending on the polarity of the field current. Such a write operation is described in unpublished patent application EP09157306 by the present applicant.

In another embodiment of the invention (not represented), the STT-based TAS-MRAM cell 100 comprises a strap, electrically connected to the magnetic tunnel junction 200, and a second select transistor. The two select transistors are electrically connected at each opposed extremity of the strap, such as described in unpublished patent application EP9290127 by the present applicant. Here, the write operation is performed by heating the junction 200 with the first portion of current, or heating current 310, flowing through the strap between the two transistors. The second portion of current, or spin-polarized current 320, is passed through the junction 200 via the current line 700. In the present embodiment, the spin-polarized current 320 can be controlled independently from the heating current 310.

A magnetic memory device (not represented) can be formed from an array comprising a plurality of STT-based TAS-MRAM cells 100 according any of the embodiments of the invention as disclosed herein. In the magnetic memory device, each junction 200 of the STT-based TAS-MRAM cells 100 is connected, on the side of the storage layer 210 to the current line 700, and on the opposite side to the word line, the latter being placed substantially perpendicular to the current line 700. When one of the STT-based TAS-MRAM cells 100 is to be written, a control current pulse is sent in one or several word lines in order to put at least one of the transistors 300 of the corresponding word lines in open mode (ON). The current pulse having the first intensity corresponding to the heating current 310, and/or possibly having the second intensity corresponding to the spin polarized write current 320, is sent to each current lines 700 corresponding to the STT-based TAS-MRAM cells 100 to be written, i.e., the STT-based TAS-MRAM cells 100 placed at the intersection of the active connecting current lines 700 and active word lines.

Reference Numbers 1 conventional MRAM cell
2 magnetic tunnel junction
21 ferromagnetic storage layer
21b antiferromagnetic storage layer
22 insulating layer
23 reference layer
24 antiferromagnetic reference layer
3 select transistor
31 heating current
32 spin polarized current
4 first field line
41 first field current
42 first magnetic field
5 second current line
51 second field current
52 second magnetic field
6 word line
7 current line
8 field line of conventional TAS-MRAM cell
81 field current
82 magnetic field
10 conventional TAS-MRAM cell
100 TAS-MRAM cell of the invention
110 first field direction
120 second field direction
130 third field direction
200 magnetic tunnel junction
210 storage layer
210b antiferromagnetic storage layer
211 first magnetization of the reference layer
220 insulating layer
230 reference layer
231 second magnetization of the reference layer
300 select transistor
310 first intensity of the spin polarized current
320 second intensity of the spin polarized current
410 field current
420 magnetic field
700 current line Reference Symbols H
$H_{ex}$
$H_R$ reversal field of the ferromagnetic storage layer
$T_{BS}$ blocking temperature of the antiferromagnetic storage layer
$T_{BR}$ blocking temperature of the antiferromagnetic reference layer
R magnetic tunnel junction resistance
RA junction resistance-area product

The invention claimed is:

1. A spin transfer torque (STT)-based magnetic random access memory (MRAM) cell with a thermally assisted switching (TAS) writing procedure, comprising:
a magnetic tunnel junction formed from a ferromagnetic storage layer having a first magnetization adjustable at a high temperature threshold, an antiferromagnetic storage layer which pins the first magnetization of the ferromagnetic storage, a ferromagnetic reference layer having a fixed second magnetization, and an insulating layer, said insulating layer being disposed between the ferromagnetic storage and reference layers, wherein the magnetocrystalline anisotropy of the ferromagnetic storage layer is substantially orthogonal to the magnetocrystalline anisotropy of the ferromagnetic reference layer and the magnetocrystalline anisotropy of the antiferromagnetic storage layer such that the first magnetization is oriented substantially orthogonal to the direction of the second magnetization of the ferromagnetic reference layer when the magnetic tunnel junction is heated to the high temperature threshold;
a select transistor being electrically connected to said magnetic tunnel junction and controllable via a word line; and
a current line, electrically connected to said magnetic tunnel junction, passing at least a write current.

2. The STT-based TAS-MRAM cell according to claim 1, wherein the cell (100) is writable by the write current passing through the junction via the current line, the write current having:
a first intensity for heating the junction at the high temperature threshold; and
a second intensity, lower than the first intensity, for switching the first magnetization of the storage layer and cooling the magnetic tunnel junction at a low temperature threshold at which the first magnetization becomes fixed.

3. The STT-based TAS-MRAM cell according to claim 1, wherein the write current is a spin polarized current for switching the first magnetization in a direction determined by the spin polarized current.

4. The STT-based TAS-MRAM cell according to claim 1, wherein said magnetic tunnel junction further comprises an antiferromagnetic reference layer pinning said second magnetization of the ferromagnetic reference layer below a blocking temperature of the antiferromagnetic reference layer.

5. A magnetic memory device formed from an array comprising a plurality of STT-based TAS-MRAM cells comprising:
a magnetic tunnel junction formed from:
a ferromagnetic storage layer having a first magnetization adjustable at a high temperature threshold;

an antiferromagnetic storage layer that pins said first magnetization of the ferromagnetic storage layer;

a ferromagnetic reference layer having a fixed second magnetization and an insulating layer, said insulating layer being disposed between the ferromagnetic storage and reference layers, wherein the magnetocrystalline anisotropy of the ferromagnetic storage layer is essentially orthogonal to the magnetocrystalline anisotropy of the ferromagnetic reference layer and the magnetocrystalline anisotropy of the antiferromagnetic layer;

a select transistor being electrically connected to said magnetic tunnel junction and controllable via a word line; and a current line, electrically connected to said magnetic tunnel junction, passing at least a write current.

6. A method of writing data in a spin transfer torque (STT)-based magnetic random access memory (MRAM) cell with a thermally assisted switching (TAS) writing procedure, wherein the STT-based TAS-MRAM cell comprises a magnetic tunnel junction formed from a storage layer having a first magnetization that is adjustable at a high temperature threshold, an antiferromagnetic layer which pins the first magnetization of the storage layer, a reference layer having a fixed second magnetization, an insulating layer disposed between the storage and reference layers, a select transistor connected to said magnetic tunnel junction and controllable via a word line, and a current line electrically connected to said magnetic tunnel junction, wherein the magnetocrystalline anisotropy of the storage layer is substantially orthogonal to the magnetocrystalline anisotropy of the reference layer and the magnetocrystalline anisotropy of the antiferromagnetic layer, the method comprising the steps of:

passing a heating current through the magnetic tunnel junction via the current line to heat the magnetic tunnel junction;

passing a field current through the field line to switch the first magnetization of the storage layer;

turning off the heating current to cool the magnetic tunnel junction after the magnetic tunnel junction has reached a high temperature threshold; and turning off the field current after the magnetic tunnel junction has cooled down to a low temperature threshold.

7. The method according to claim 6, wherein said write current is a spin polarized current switching the first magnetization in a direction according to the spin orientation of the spin-polarized current.

8. The method according to claim 6, wherein said switching the first magnetization is performed from an orientation, substantially orthogonal to the direction of the second magnetization, to a switched direction, substantially parallel or antiparallel with the direction of the second magnetization.

9. A method of manufacturing a spin transfer torque (STT)-based magnetic random access memory (MRAM) cell with a thermally assisted switching (TAS) writing procedure, the STT-based TAS-MRAM cell comprising a magnetic tunnel junction formed from a storage layer having a first magnetization that is adjustable at a high temperature threshold, an antiferromagnetic layer which pins the first magnetization of the storage layer, a reference layer having a fixed second magnetization, and an insulating layer, said insulating layer being disposed between the storage and reference layers; wherein the magnetocrystalline anisotropy of the storage layer is substantially orthogonal to the magnetocrystalline anisotropy of the reference layer and the magnetocrystalline anisotropy of the antiferromagnetic layer; the method comprising the steps of:

depositing said reference layer with an applied external magnetic field having a first field direction;

depositing said storage layer with the applied external magnetic field having a second field direction, substantially perpendicular to said first field direction; and annealing said magnetic tunnel junction with the applied external magnetic field having a third field direction substantially parallel or antiparallel to the first field direction.

10. The STT-based TAS-MRAM cell according to claim 1, wherein the antiferromagnetic storage layer pins said first magnetization of the ferromagnetic storage layer at a low temperature threshold and unpins the first magnetization at the high temperature threshold.

* * * * *

UNITED STATES PATENT AND TRADEMARK OFFICE
CERTIFICATE OF CORRECTION

PATENT NO. : 8,385,107 B2
APPLICATION NO. : 12/773318
DATED : February 26, 2013
INVENTOR(S) : Ioan Lucian Prejbeanu It is certified that error appears in the above-identified patent and that said Letters Patent is hereby corrected as shown below:

In the specification, column 1, line 60, delete "open" and insert -- on --

In the specification, column 7, line 65, delete "at" and insert -- to --

In the specification, column 7, line 65, delete "comprised"

In the specification, column 7, line 67, delete "210bbut" and insert -- 210b but --

Signed and Sealed this
Eighteenth Day of June, 2013

Teresa Stanek Rea
*Acting Director of the United States Patent and Trademark Office*